United States Patent [19]
Kishimura

[11] Patent Number: 5,648,199
[45] Date of Patent: Jul. 15, 1997

[54] METHOD OF FORMING A RESIST PATTERN UTILIZING AN ACID WATER-SOLUBLE MATERIAL OVERLAYER ON THE RESIST FILM

[75] Inventor: Shinji Kishimura, Hyogo, Japan

[73] Assignee: Mitsubishi Denki Kabushiki Kaisha, Tokyo, Japan

[21] Appl. No.: 561,598

[22] Filed: Nov. 21, 1995

Related U.S. Application Data

[63] Continuation of Ser. No. 329,748, Oct. 26, 1994, abandoned.

[30] Foreign Application Priority Data

Jun. 24, 1994 [JP] Japan .................................. 6-143131

[51] Int. Cl.⁶ .............................. G03F 7/30; G03F 7/38; G03F 7/40
[52] U.S. Cl. ...................... 430/311; 430/166; 430/326; 430/327; 430/330
[58] Field of Search ............................ 430/166, 311, 430/327, 330, 326

[56] References Cited

U.S. PATENT DOCUMENTS 5,162,193  11/1992  Murray et al. .......................... 430/166

FOREIGN PATENT DOCUMENTS 1-106049  4/1989  Japan .

*Primary Examiner*—Christopher G. Young
*Attorney, Agent, or Firm*—Lowe, Price, LeBlanc & Becker

[57] ABSTRACT

A method of forming a resist pattern is provided that has high resolution, wide focus margin, and favorable configuration, and high sensitivity. A resist film of a type that is developed with an alkali developer and that is subject to chemical change upon receiving light is formed on a semiconductor substrate. On the resist film, an acid film is formed of an acid water-soluble material, and that has transmittance of at least 70% before and during exposure of the light when the film thickness thereof is 1 μm. The light is selectively directed towards the resist film, whereby an image is formed in the resist film. The resist film is developed with an alkali developer to form a resist pattern.

12 Claims, 5 Drawing Sheets

NQD      INDENE KETENE      INDENE CARBOXYLIC ACID

METHOD OF FORMING A RESIST PATTERN UTILIZING AN ACID WATER-SOLUBLE MATERIAL OVERLAYER ON THE RESIST FILM

This application is a continuation of application Ser. No. 08/329,748 filed Oct. 26, 1994, now abandoned.

BACKGROUND OF THE INVENTION

1. Field of the Invention

The present invention relates to a method of forming a resist pattern, and more particularly to a method of forming a resist pattern improved to provide a resist pattern of a favorable configuration with high resolution and wide depth of focus. Also, the present invention relates to an acid water-soluble material composition used in such a method.

2. Description of the Background Art

The formation process of a resist pattern is critical in the manufacturing method of a large scale integrated circuit (LSI) such as 4-M and 16-M dynamic random access memories (DRAM). The method of forming a resist pattern includes the steps of selectively irradiating a positive type photoresist of novolac resin and naphthoquinone diazide with a g-line ray (wavelength 463 nm) of a mercury lamp, followed by a developing step.

In recent years, the integration density has become higher such as the level of 16M and 64M. In a LSI having such microstructures, an i-line ray (wavelength 365 nm) which has a wavelength shorter than that of a g-line ray is used as the light source in forming a resist pattern.

As the integration density of a LSI is further increased, it will become difficult to manufacture a resist pattern that is below half micron in a stable manner using an i-line ray. There has been intensive research efforts to form a resist pattern using a KrF excimer laser (wavelength 248 nm) and an ArF excimer laser (wavelength 193 nm) which have a shorter wavelength as a light source.

In the technology using such an excimer laser beam, not only modification of the type of light source, but also development of a new resist material is essential. This is because a high resolution resist pattern that has a sidewall perpendicular to the substrate cannot be obtained if a conventional novolac-naphthoquinone diazide type resist which was used for g-line and i-line is employed as the resist subjected to excimer laser beam due to its great absorbance. A novel resist material that has superior characteristics with respect to an excimer laser beam has not yet been found. In view of such problems of the light source and the material of a resist, it is preferable to develop a technique for forming a resist pattern that provides high resolution and wide process margin from an evolution of conventional technology, i.e., using i-line and g-line rays and a general novolac-naphthoquinone diazide type resist.

A conventional method of forming a resist pattern using a novolac-naphthoquinone diazide type resist will be described hereinafter.

Figure 7:
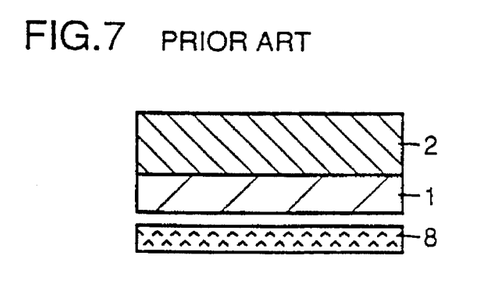
FIGS. 7–10 are sectional views of a semiconductor device showing first–fourth steps according to a conventional method of manufacturing a resist pattern.

Referring to FIG. 7, a resist is applied on a substrate 1, which is prebaked to result in a resist film 2. Prebaking is carried out using a hot plate 8.

Figure 8:
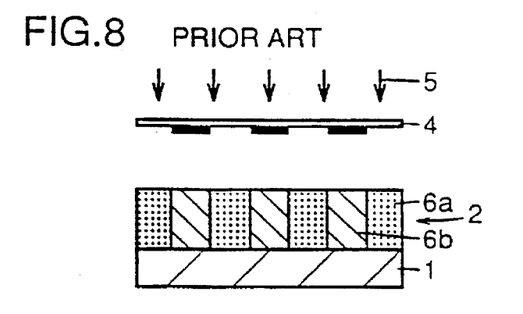
Figure 11:
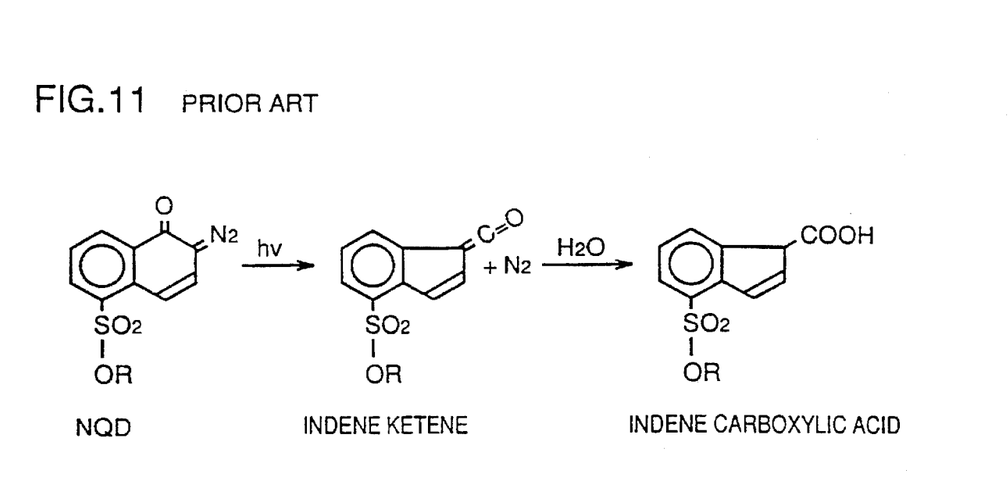
FIG. 11 shows a reaction formula of the photo chemical reaction of naphthoquinone diazide (NQD).

Referring to FIG. 8, an i-line beam 5 is selectively directed towards resist film 2 using a reticle 4. i-light beam 5 is formed by an i-line stepper. Here, resist film 2 is divided into an exposed region 6a and a non-exposed region 6b. Referring to FIG. 11, the exposed region has naphthoquinone diazide (NQD) rendered to indene carboxylic acid via indene ketene. Indene carboxylic acid is soluble in an alkali developer.

Figure 9:
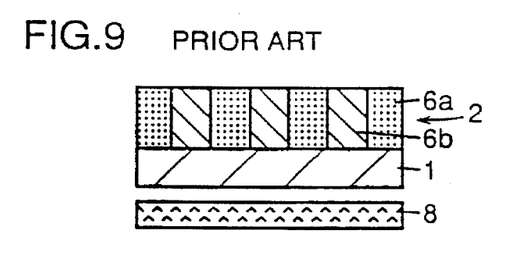

Referring to FIG. 9, baking is carried out after exposure and before developing. This baking is carried out for the purpose of reducing the effect of a standing wave that occurs due to interference between incident light and reflected light from the underlying substrate to obtain a favorable pattern configuration of high resolution. This step is called post exposure baking (PEB). PEB is carried out using hot plate 8.

Figure 10:
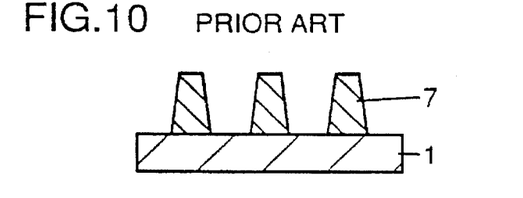

Referring to FIG. 10, resist film 2 is developed using an alkali developer such as tetramethyl ammonium hydroxide solution. Exposed region 6a is removed to result in a resist pattern 7.

The above-described conventional resist pattern formation had the following problems.

Referring to FIG. 10, a resist pattern having a sidewall perpendicular to substrate 1 cannot be obtained due to the increase in the reduced film of the non-exposed portion. This is because light does not reach the bottom of resist film 2.

In order to solve the above-described problem, i.e. to suppress the film reduction of the non-exposed portion, an improvement is effected of reducing the solubility speed of the resist film with respect to the developer for the currently used high resolution positive type photoresists. However, with this improvement, the solubility speed of the exposed portion could not be increased. Sufficient difference in the solubility speed between an exposed portion and a non-exposed portion could not be achieved. Therefore, sufficient resolution and favorable resist configuration could not be obtained.

SUMMARY OF THE INVENTION

In view of the foregoing, an object of the present invention is to provide a method of forming a resist pattern improved to allow increase in the solubility speed of an exposed region.

Another object of the present invention is to provide a method of forming a resist pattern improved to render a resist surface layer portion of a non-exposed region insoluble.

A further object of the present invention is to provide a method of forming a resist pattern improved to increase the solubility speed of an exposed portion and rendering a resist surface layer portion of a non-exposed region insoluble, which in turn improves the contrast.

Still another object of the present invention is to provide a method of forming a resist pattern improved to increase the resolution.

A still further object of the present invention is to provide a method of forming a resist pattern improved to increase the process margin.

Yet a further object of the present invention is to provide a method of forming a resist pattern improved to allow a resist pattern that has a sidewall perpendicular to a substrate.

Yet another object of the present invention is to provide an acid water-soluble material component applicable to such methods.

In a method of forming a resist pattern according to an aspect of the present invention, a resist film is formed of a type that is developed with an alkali developer and subject to chemical change upon receiving light on a semiconductor substrate. On the resist film, an acid film is formed of an acid water-soluble material having a transmittance of at least 70% prior to and during exposure by said light when the film thickness thereof is 1 μm. The light is selectively directed towards the resist film to form an image in the resist film. The resist film is developed with an alkali developer, resulting in formation of a resist pattern.

In a method of a forming a resist pattern according to another aspect of the present invention, on a semiconductor substrate, a resist film is formed of a type that is developed with an alkali developer and that is subject to chemical change upon receiving light. On the resist film, an acid film is formed of an acid water-soluble material having a transmittance of at least 70% before and during exposure by the light when the film thickness thereof is 1 μm. Then, the acid film is removed. The light is selectively directed towards the resist film to form an image in the resist film. The resist film is developed with an alkali developer, resulting in formation of a resist film.

According to a preferable embodiment of the present invention, resin of an acid group such as carboxylic acid and sulfonic acid is preferably used for the acid water-soluble material. Polyacrylic acid, polyallyl sulfonic acid, poly (2-acrylamide-2-methyl propane sulfonic acid), alginic acid, or the like can be cited as a resin including an acid group.

Another favorable example of an acid water-soluble material of the present invention includes a water-soluble resin and a low molecular organic compound such as carboxylic acid and sulfonic acid.

Polyacrylic acid, alginic acid, pullulan, poly (N-vinyl pyrrolidone), polyvinyl alcohol, polyethylene oxide can be cited as water-soluble resin.

Carboxylic acid such as gallic acid, benzoic acid, o-benzoyl benzoic acid, 2-bromoacetic acid and sulfonic acid such as benzene sulfonic acid, 4-phenol sulfonic acid, 4-chlorobenzene sulfonic acid, 2-cyclohexyl aminoethane sulfonic acid, 3-cychlohexyl aminoethane sulfonic acid, dichloro benzene sulfonic acid, dodecyl benzene sulfonic acid, ethane sulfonic acid, ethyl benzene sulfonic acid, 2-hydroxy-4-methoxy benzophenone-5-sulfonic acid, 3-hydroxy propane sulfonic acid, methane sulfonic acid, naphthalene sulfonic acid, m-nitro benzene sulfonic acid, o-nitro benzene sulfonic acid, p-nitro benzene sulfonic acid, p-toluene sulfonic acid, 2, 4, 5-trichloro benzene sulfonic acid, trifluoro methane sulfonic acid, m-xylene-4-sulfonic acid, p-xylene-2-sulfonic acid can be cited as an acid low molecular organic compound.

According to a further aspect of the present invention, an acid water-soluble material composition is applied on a resist film of a type that is developed with an alkali developer and that is subject to chemical change upon receiving light. The acid water-soluble material composition includes water, and resin of a acid group such as carboxylic acid or sulfonic acid.

According to still another aspect of the present invention, an acid water-soluble material composition is applied on a resist film of a type that is developed with an alkali developer and that is subject to chemical change upon receiving light. The acid water-soluble material composition includes water, water-soluble resin, and an acid low molecular organic compound such as carboxylic acid and sulfonic acid.

According to a method of forming a resist pattern of the above one and the another aspect of the present invention, an acid film is formed on a resist film, whereby a mixing layer is formed at the interface between the resist film and the acid film. In an exposed portion, hydrogen ions are diffused from the mixing layer into the resist film, whereby the exposed portion becomes more soluble in an alkali developer. In contrast, in a non-exposed portion, the mixing layer formed on the resist film reduces the solubility speed of the non-exposed portion with respect to the alkali developer.

According to an acid water-soluble material composition according to the above-described further and still another aspect of the present invention, a mixing layer of a resist film and an acid water-soluble material composition is formed at the surface of the resist film when the acid water-soluble material composition is applied on the resist film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described hereinafter with reference to the drawings.

Figure 1:
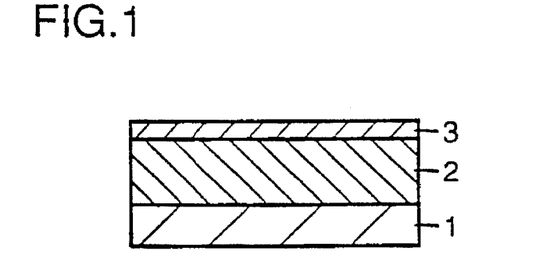
FIGS. 1–3 are sectional views of a semiconductor device showing first–third steps of a method of manufacturing a resist pattern according to the present invention.

Referring to FIG. 1, on a substrate 1, a resist composition including a photosensitive agent having a quinone diazide portion and novolac resin is applied, followed by a prebaking step. As a result, a resist film 2 is formed. An acid film 3 is formed on resist film 2. The acid film is formed of an acid water-soluble material which will be described afterwards. When the film thickness is 1 μm, the transmittance is at least 70% before exposure and during exposure by light. The film thickness of acid film 3 is preferably approximately 1000 Å–2000Å.

As a technique similar to that of the present invention, Japanese Patent Laying-Open No. 1-106049 discloses a technique for forming a contrast enhancement layer (CEL layer) on a resist film. However, this CEL layer has low light transmittance before and during exposure. In contrast, the acid film used in the present invention has a light transmittance of at least 70% prior to and during exposure when the film thickness is 1 μm. The technique of the present application is clearly different from that disclosed in the above-described Japanese Patent Laying-Open No. 1-106049.

Figure 2:
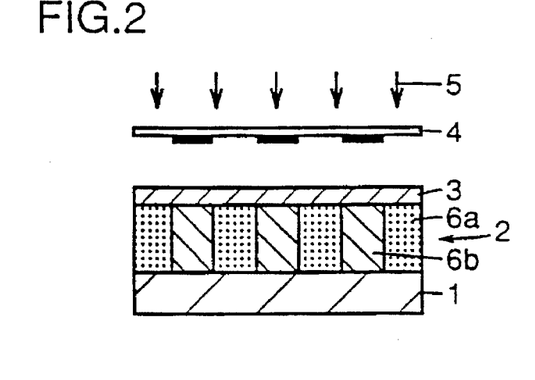

Referring to FIG. 2, an i-line beam 5 is selectively directed towards resist film 2 using a reticle 4 with acid film 3 still remaining. As a result, an image is formed in resist film 2. Resist film 2 is divided into exposed portions 6a and non-exposed portions 6b.

Figure 6:
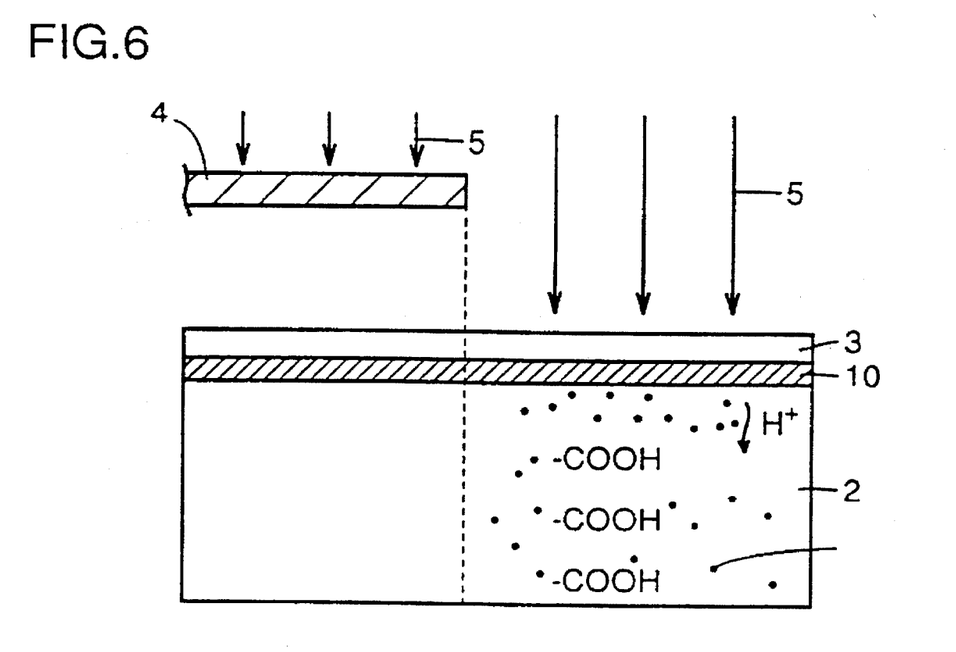
FIG. 6 shows the effect of a mixing layer according to the present invention.

In the present embodiment, a mixing layer 10 is formed at the boundary of resist film 2 and acid film 3 when acid film 3 is applied on resist film 2 as shown in FIG. 6. As mentioned above, in the exposed portion, NQD is rendered into indene carboxylic acid via indene ketene. In the exposed portion, hydrogen ions 30 in the acid substance diffuse from mixing layer 10 into resist film 2. As a result, the solubility speed of the exposed portion with respect to an alkali developer is increased. In the non-exposed portion, mixing layer 10 serves to reduce the solubility speed of the non-exposed portion of the resist film with respect to the alkali developer.

The degree of hydrogen ion diffusion into resist film 2 can be adjusted by the baking process following application of the water-soluble material.

In the non-exposed portion, the solubility speed of the insoluble layer (mixing layer 10) above the resist film can be adjusted according to the bake process following the application of a resist solution on substrate 1, and by the bake process after the application of a water-soluble material 3.

Figure 3:
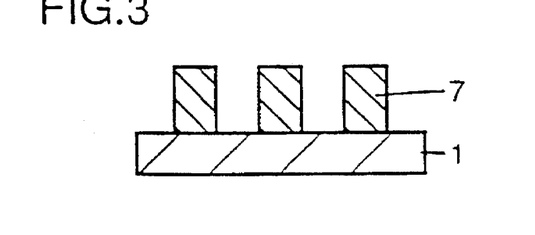

Referring to FIGS. 2 and 3, resist film 2 is developed with an alkali developer, resulting in a resist pattern 7 having a sidewall perpendicular to substrate 1.

Figure 4:
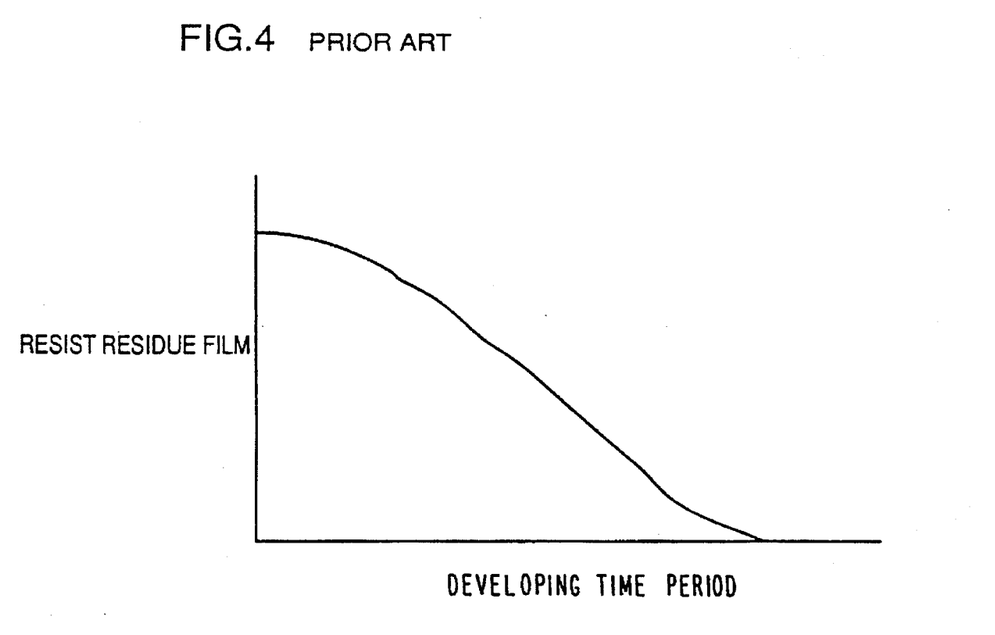
FIG. 4 is a diagram showing the relationship between developing time and a resist residue film according to a conventional method of forming a resist pattern.
Figure 5:
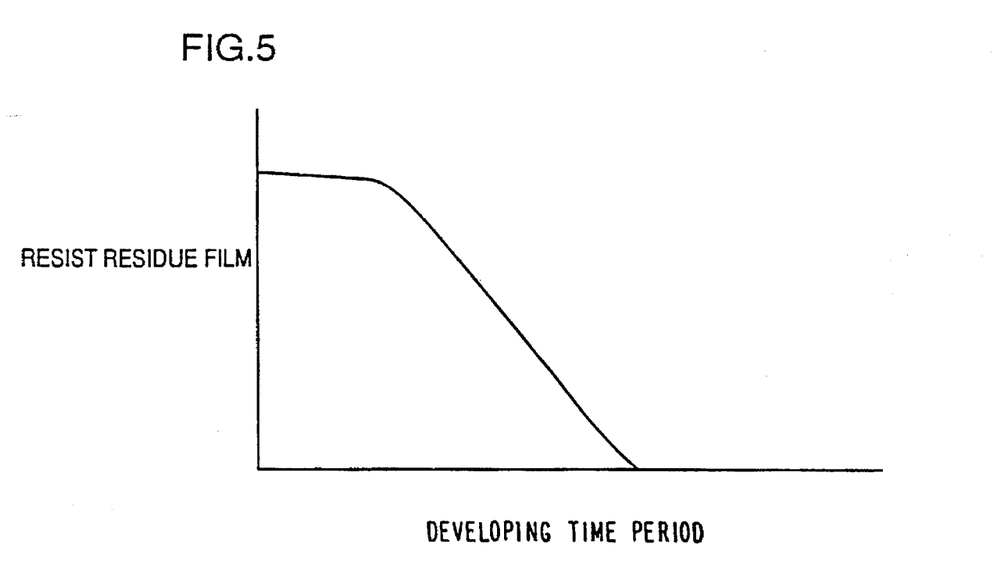
FIG. 5 is a diagram showing the relationship between the developing time and a resist residue film according to a method of forming a resist pattern of the present invention.

FIG. 4 shows the relationship between the developing time and the resist residue film by a certain amount of exposure obtained according to a conventional method of forming a resist film. FIG. 5 shows the same according to an embodiment of the present invention.

By comparing FIGS. 4 and 5, it is appreciated that the solubility speed in the vicinity of surface of the resist film is reduced while the solubility speed within resist film 2 is increased according to the present embodiment, whereby the time required for the entire resist film to be removed by development is reduced. Therefore, the sensitivity is improved.

According to the present embodiment, the difference between the solubility speed in development of an exposed portion and a non-exposed portion is increased, so that high resolution can be obtained. Because reduction of the resist film in the non-exposed portion can be suppressed, film reduction at the time of defocus can be suppressed. As a result, the focus margin is increased, and a favorable resist pattern can be obtained. Therefore, sensitivity is further improved.

The present invention will be described in detail using specific values.

EXAMPLE 1-13

The acid water-soluble material used in these examples is summarized in the following Table 1.

TABLE 1

| Acid Water-Soluble Material | Water-Soluble Resin | Acid Low Molecular Organic Compound | Included Rate with Respect to Water-Soluble Resin |
| --- | --- | --- | --- |
| I | polyallyl sulfonic acid | — | — |
| II | polyacrylic acid | — | — |
| III | polyallyl sulfonic acid | 4-phenol sulfonic acid | 3 wt % |
| IV | polyacrylic acid | 4-phenol sulfonic acid | 3 wt % |
| V | polyvinyl alcohol | benzoic acid | 3 wt % |
| VI | polyvinyl alcohol | gallic acid | 3 wt % |
| VII | polyvinyl alcohol | benzene sulfonic acid | 3 wt % |
| VIII | polyvinyl alcohol | p-toluene sulfonic acid | 3 wt % |
| IX | polyvinyl alcohol | 4-phenol sulfonic acid | 3 wt % |
| X | polyvinyl alcohol | 4-phenol sulfonic acid | 5 wt % |

Referring to FIG. 1 again, "PFRIX700" (a product of Japan Synthetic Rubber Co., Ltd.) (12) including a photosensitive agent having a quinone diazide portion and a novolac resin was spin-coated on a silicon wafer 1. The spincoating condition was selected so that the resist film thickness was 1 μm when baked for 60 seconds at 90° C. on a hot plate 8. Then, the acid water-soluble material (3) listed in Table 1 was applied. The baking conditions, the used acid water-soluble material, the process sequence (application of resist→baking→application of water-soluble material→baking→exposure→peeling off water-soluble material film→PEB→development) are summarized in the following Table 2. In Table 2, a circle indicates that the process was carried out. The relevant process was not carried out if there is no circle. The film thickness of the acid water-soluble material was approximately 1000Å–2000Å.

TABLE 2

| | Process Sequence | | | | | | | |
| --- | --- | --- | --- | --- | --- | --- | --- | --- |
| | Application of Resist | Baking (90° C., 60 seconds) | Application of Water-Soluble Material[1] | Baking (90° C., 60 seconds) | Exposure | Peeling off Water-Soluble Material Film | PEB (120° C., 90 seconds) | Development |
| Example | | | | | | | | |
| 1 | o | o | I | — | o | o | o | o |
| 2 | o | o | II | — | o | o | o | o |
| 3 | o | o | III | — | o | o | o | o |
| 4 | o | o | IV | — | o | o | o | o |
| 5 | o | o | V | — | o | o | o | o |
| 6 | o | o | VI | — | o | o | o | o |
| 7 | o | o | VII | — | o | o | o | o |
| 8 | o | o | VIII | — | o | o | o | o |

TABLE 2-continued

| | | | Process Sequence | | | | | |
|---|---|---|---|---|---|---|---|---|
| | Application of Resist | Baking (90° C., 60 seconds) | Application of Water-Soluble Material[1] | Baking (90° C., 60 seconds) | Exposure | Peeling off Water-Soluble Material Film | PEB (120° C., 90 seconds) | Development |
| 9 | o | o | IX | — | o | o | o | o |
| 10 | o | o | X | — | o | o | o | o |
| 11 | o | o | X | — | o | — | o | o |
| 12 | o | o | X | o | o | o | o | o |
| 13 | o | — | X | o | o | o | o | o |
| Comparative Example | o | o | — | — | o | — | o | o |

[1] The type of water-soluble material used (indicated by Arabic numerals) is listed in Table 1.

Referring to FIG. 2 again, resist film 2 having an acid water-soluble material (3) applied was exposed using an i-line stepper "NSR-2005i8A" (a product of Nikon). Then, according to the sequence shown in Table 2, the water-soluble material film was peeled off by water rinsing, PEB was carried out on a hot plate at 120° C. for seconds, and then developed according to a spray paddle method for 60 seconds using a 2.38 wt % tetramethyl ammonium hydroxide solution "NMD-3" (a product of Tokyo Ohka Industry Co., Ltd.). As a result, resist pattern 7 is obtained.

Table 3 summarizes the sensitivity of a hole pattern of 0.4 µm□ (exposure amount msec when finished as mask), the marginal resolution of a hole pattern (favorable as this value um is lower), the resolution focus of depth of the hole pattern of 0.4 µm□ (favorable as this value is greater), and a sectional view of the resist pattern. In Table 3, the example number corresponds to the example number of Table 2.

TABLE 3

| Embodiment | Sensitivity of 0.4 µm□ Hole Pattern (msec) | Marginal Resolution of Hole Pattern (µm) | Resolution Focus Depth of 0.4 µm□ Hole Pattern (µm) | Sectional Configuration of 0.4 µm□ Hole Pattern |
|---|---|---|---|---|
| 1 | 780 | 0.32 | 1.2 | \/ |
| 2 | 750 | 0.32 | 1.2 | \/ |
| 3 | 720 | 0.30 | 1.5 | \/ |
| 4 | 700 | 0.28 | 1.5 | \/ |
| 5 | 750 | 0.28 | 1.5 | \/ |
| 6 | 780 | 0.28 | 1.5 | \/ |
| 7 | 800 | 0.30 | 1.5 | \/ |
| 8 | 800 | 0.32 | 1.5 | \/ |
| 9 | 750 | 0.26 | 1.8 | \/ |
| 10 | 700 | 0.26 | 2.0 | \/ |
| 11 | 820 | 0.30 | 1.5 | \/ |
| 12 | 700 | 0.26 | 2.0 | \/ |
| 13 | 800 | 0.28 | 1.8 | \/ |
| Comparative Example | 850 | 0.36 | 1.0 | \/ |

COMPARATIVE EXAMPLE

The results obtained according to a conventional method of forming a resist pattern is shown as the comparative example. The same resist used in the above-examples "PFRIX700" was spin-coated on a silicon wafer, which was prebaked for 60 seconds at 90° C. on a hot plate. As a result, a resist film a film thickness of 1 µm was obtained. Similar to examples 1–13, this resist film was exposed using an i-line stepper "NSR-2005i8A". Then, this was subject to PEB on a hot plate for 90 seconds at 120° C. Then, it was developed by a spray paddle system for 60 seconds with the "NMD-3" developer, resulting in a resist pattern. The process sequence of the comparative example is together shown in Table 2 with the results shown in Table 3.

It is apparent from the result of Table 3 that, according to a method of forming a resist pattern of the present invention, a resist pattern of high resolution, wide focus margin, and favorable configuration can be obtained. Also, high sensitivity can be achieved.

The above embodiment was described in which a water-soluble material is applied on a resist film, followed by exposure of the resist with the water-soluble material still remaining. The acid film provides a novel effect of functioning as a reflection-preventing film. However, the present invention is not limited to the above-described embodiment. A corresponding effect can be obtained by applying a water-soluble material, forming a mixing layer of a resist film and the water-soluble material, immediately removing the water-soluble material film, and then carrying out exposure of the resist film. In this case, the effect of an anti-reflection film cannot be obtained.

Referring to examples 1–10, by peeling off the water-soluble material after the exposure and before the development, formation of a strongly bonded mixing layer is prevented.

Example 13 is characterized in that the resist film is not baked. An appropriate effect can be obtained even if this baking step is omitted.

According to the present invention, an acid film is formed on a resist film, whereby a mixing layer is formed at the boundary of the resist film and the acid film. In an exposed portion, hydrogen ions diffuse into the resist film from the mixing layer, whereby the development speed of the exposed portion is increased. In a non-exposed portion, the mixing layer serves to reduce the solubility speed of the non-exposed portion with respect to an alkali developer. As a result, a resist pattern of high resolution, wide focus margin, and of favorable configuration can be obtained. Also, high sensitivity can be achieved.

By an acid water-soluble material composition according to the present invention, a mixing layer of a resist film and an acid water-soluble material composition is formed at the surface of the resist film when the acid water-soluble material composition is applied on the resist film. This mixing layer increases the developing speed of the exposed portion, and reduces the solubility speed of the non-exposed portion with respect to an alkali developer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a resist pattern comprising the steps of:

forming on a semiconductor substrate a resist film which is developable with an alkali developer and which is subject to chemical change upon receiving light, forming on said resist film an acid film of an acid water-soluble material, said acid film having a transmittance of at least 70% before and during exposure by said light when the acid film thickness is 1 µm, providing an image-wise exposure of the light towards the resist film with said acid film therebetween, removing said acid film, post-exposure baking said resist film, and developing said resist film with an alkali developer, whereby a resist pattern is formed.

2. The method of forming a resist pattern according to claim 1, further comprising the step of baking said resist film before formation of said acid film.

3. The method of forming a resist pattern according to claim 2, further comprising the step of baking said resist film and said acid film before directing said light.

4. The method of forming a resist pattern according to claim 1, further comprising the step of baking said resist film and said acid film before directing said light.

5. The method of forming a resist pattern according to claim 1, wherein said resist film comprises a photosensitive agent including a quinone diazide portion, and a novolac resin.

6. The method of forming a resist pattern according to claim 1, wherein said acid film has a film thickness of 500Å–2000Å.

7. The method of forming a resist pattern according to claim 1, wherein said acid water-soluble material comprises a resin including an acid group selected from the group consisting of carboxylic acid and sulfonic acid.

8. The method of forming a resist pattern according to claim 7, wherein the resin including an acid group is selected from the group consisting of polyacrylic acid, polyallyl sulfonic acid, poly (2-acrylamide-2-methyl propane sulfonic acid) and alginic acid.

9. The method of forming a resist pattern according to claim 1, wherein said acid water-soluble material comprises a water-soluble resin and an acid low molecular organic compound comprising carboxylic acid or sulfonic acid.

10. The method forming a resist pattern according to claim 9, wherein the water-soluble resin is selected from the group consisting of polyacrylic acid, alginic acid, pullulan, poly (N-vinyl pyrrolidone), polyvinyl alcohol and polyethylene oxide.

11. The method of forming a resist pattern according to claim 9, wherein the acid low molecular organic compound is selected from the group consisting of gallic acid, benzoic acid, o-benzoyl benzoic acid, 2-bromoacetic acid, benzene sulfonic acid, 4-phenol sulfonic acid, 4-chlorobenzene sulfonic acid, 2-cyclohexyl aminoethane sulfonic acid, 3-cyclohexyl aminoethane sulfonic acid, dichloro benzene sulfonic acid, dodecyl benzene sulfonic acid, ethane sulfonic acid, ethyl benzene sulfonic acid, 2-hydroxy-4-methoxy benzophenone-5-sulfonic acid, 3-hydroxy propane sulfonic acid, methane sulfonic acid, naphthalene sulfonic acid, m-nitro benzene sulfonic acid, o-nitro benzene sulfonic acid, p-nitro benzene sulfonic acid, p-toluene sulfonic acid, 2,4, 5-trichloro benzene sulfonic acid, trifluoro methane sulfonic acid, m-xylene-4-sulfonic acid and p-xylene-2-sulfonic acid.

12. A method of forming a resist pattern comprising the steps of:

forming on a semiconductor substrate a resist film which is developable with an alkali developer, and which is subject to chemical change upon receiving light, forming on said resist film an acid film of an acid water-soluble material, said acid film having a transmittance of at least 70% before and during exposure by said light when the acid film thickness is 1 µm, removing said acid film, selectively directing said light towards said resist film to form an image in said resist film, and developing said resist film with an alkali developer, whereby a resist pattern is formed.

* * * * *